United States Patent
Torres et al.

(10) Patent No.: US 6,815,779 B1
(45) Date of Patent: Nov. 9, 2004

(54) INTEGRATED CIRCUIT INCLUDING PROTECTION AGAINST POLARITY INVERSION OF THE SUBSTRATE POTENTIAL

(75) Inventors: Antonino Torres, Palermo (IT); Sergio Tommaso Spampinato, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/497,916

(22) Filed: Feb. 4, 2000

(30) Foreign Application Priority Data

Feb. 9, 1999 (EP) .............................................. 99830066

(51) Int. Cl.[7] ......................... H01L 29/76; H01L 27/082
(52) U.S. Cl. ..................... 257/373; 257/370; 257/578; 327/417
(58) Field of Search ................................ 257/578–580, 257/583, 370, 373; 327/417

(56) References Cited

U.S. PATENT DOCUMENTS

| | | | |
|---|---|---|---|
| 5,051,612 A | 9/1991 | Agiman | 307/296.2 |
| 5,072,287 A * | 12/1991 | Nakagawa et al. | 357/50 |
| 5,159,207 A | 10/1992 | Pavlin et al. | 307/296.2 |
| 5,382,837 A | 1/1995 | Aiello et al. | 327/417 |

FOREIGN PATENT DOCUMENTS

| | | | | |
|---|---|---|---|---|
| EP | A-0 734 070 | | 9/1996 | H01L/29/00 |
| JP | 5-109994 | * | 4/1993 | H01L/2/06 |

* cited by examiner

Primary Examiner—Ori Nadav
(74) Attorney, Agent, or Firm—Lisa K. Jorgenson; James H. Morris; Wolf, Greenfield & Sacks, P.C.

(57) ABSTRACT

An integrated circuit including a vertical power component having a terminal formed by a chip substrate of a first conductivity type, a control circuit thereof, the control circuit isolated from the substrate by an isolation region of a second conductivity type, and a protection structure against polarity inversion of a substrate potential. The protection structure includes a first bipolar transistor with an emitter connected to said isolation region and a collector connected to a reference potential input of the integrated circuit, a bias circuit for biasing the first bipolar transistor in a reverse saturated mode when the substrate potential is higher than the reference potential, and a second bipolar transistor with an emitter connected to the substrate and a base coupled to the isolation region for coupling the isolation region to the substrate through a high-impedance when the substrate potential is lower than the reference potential.

20 Claims, 7 Drawing Sheets

INTEGRATED CIRCUIT INCLUDING PROTECTION AGAINST POLARITY INVERSION OF THE SUBSTRATE POTENTIAL

BACKGROUND OF THE INVENTION

1. Field of the Invention

The present invention relates to the field of intergrated circuits. More specifically, the invention relates to a structure for the protection of integrated circuits against polarity inversion of the substrate potential.

2. Discussion of the Related Art

VIPower ("Vertical Intelligent Power) denotes integrated circuits which, in a same chip, integrate one or more vertical power components (power bipolar transistors) and a circuitry (control circuitry) for controlling the switching of the power components.

VIPower integrated circuits typically comprise a common semiconductor substrate forming one electrode of the power component.

In VIPower integrated circuits, in order to electrically separate from each other and from the substrate the components of the control circuitry, a P type doped region (called an isolation region) is provided.

FIG. 1 shows in cross-section a portion of a control circuitry of a VIPower integrated circuit. On an N+ substrate 1, an N– layer 2 is epitaxially formed. A P type isolation region 3 is formed inside the N– layer 2. The P type isolation region 3 defines two isolated N– layer portions 4, 5 which are isolated from each other and from the N– layer 2. Inside N– layer portion 4 a PNP bipolar transistor T1 of the control circuitry is formed, while in the N– layer portion 5 an NPN bipolar transistor T2 of the control circuitry is formed.

By properly biasing the P type isolation region 3 at the ground potential (or, more generally, at the lowest potential existing in the integrated circuit), the PN junctions formed by the isolation region 3, the N– layer 2 and the N– layer portions 4, 5 are reverse-biased, so that electrical isolation is achieved. This is necessary in order to assure that parasitic bipolar transistors Qn1, Qn2, Qn3 are kept off.

In VIPower technology, the PN junction formed by the P type isolation region 3 and the N– layer 2 has a structure capable of sustaining high reverse voltages, typically of some hundreds of volts.

FIG. 2 is a schematic electrical diagram showing a possible use of a VIPower integrated circuit. Specifically, FIG. 2 depicts a circuit arrangement wherein a VIPower integrated circuit 8 is used for controlling a high-voltage IGBT (Insulated Gate Bipolar Transistor) 7. The VIPower integrated circuit chip 8 and the IGBT chip 7 are advantageously housed in a same package 6 and constitute a driver for a coil 9. In this arrangement the common N+ substrate of the VIPower integrated circuit 8 (N+ substrate 1 in FIG. 1) is electrically connected to the collector of the IGBT 7. In the example shown in FIG. 2, wherein an IGBT is used, the IGBT chip and the VIPower chip are advantageously housed in a same package. This is only an example. If the power device used to drive the coil were a power bipolar transistor, which can be directly integrated in the VIPower chip, the VIPower chip can directly drive the coil, without the need of having an IGBT chip.

Externally, the package 6 appears as a three-terminal device having a control terminal 10 (receiving a control or trigger signal TRIGGER, typically a logic signal switching between ground and 5 V) and two drive terminals 11, 12. Terminal 12 is connected to a first battery pole, providing a reference potential (ground). Terminal 11 is connected to a first terminal of the coil 9, the second terminal of the coil 9 being connected to a second battery pole BAT which, in normal operating conditions, is at a potential higher than that of the first pole.

Referring to the circuit arrangement of FIG. 2, it is necessary to guarantee that in case the polarity of the battery is inadvertently inverted the VIPower integrated circuit is not destroyed. Typical battery voltages have values up to 24 V. So, the VIPower integrated circuit must be capable of sustaining reverse voltages of –24 V without being damaged.

The IGBT inherently has a structure capable of sustaining such reverse voltages. By contrast, as far as the control circuitry is concerned, if the P type isolation region 3 is kept biased at the ground voltage as usual, and if the polarity of the battery were inadvertently inverted, the PN junction between the P type isolation region and the substrate would be forward biased, which would cause the destruction of the VIPower integrated circuit.

The same problem is encountered even if the IGBT is not provided, and the power component (power bipolar transistor) directly integrated in the VIPower chip is used to directly drive the coil.

It is thus necessary to properly bias the P type isolation region, so as to assure that not only the components of the control circuitry are electrically isolated from each other and from the substrate, but also the possibility of an inversion of the polarity of the substrate potential.

A known solution is described in U.S. Pat. No. 5,382,837. FIG. 3 is an electrical equivalent circuit of such a solution. FIG. 4 is a circuit diagram similar to that of FIG. 3, showing a possible practical implementation of the circuit of FIG. 3. With reference to FIG. 3, the isolation region (ISO) of the control circuitry of the VIPower integrated circuit is connected to the common collectors of two NPN bipolar transistors Q1, Q2. Transistor Q1 has the emitter connected to ground, transistor Q2 has the emitter connected to the substrate (SUB) of the VIPower integrated circuit. The base of transistor Q1 is connected through a bias resistor R1 to a voltage supply Vd. The base of transistor Q2 is kept at a constant pre-set bias voltage by a bias circuit 13, a possible implementation of which is shown in FIG. 4. All the transistors that are connected to the substrate of the VIPower integrated circuit, such as Q2 in FIGS. 3 and 4, are high-voltage vertical transistors whose emitter coincides with the substrate and whose base is a P type doped region similar to but isolated from the P type isolation region of the control circuitry of the VIPower integrated circuit.

In the circuits of FIGS. 3 and 4, in normal operating conditions, when the potential of the substrate (SUB) is positive, transistor Q2 is off and transistor Q1, in saturation, biases the isolation region (ISO) at VCE,sat(Q1). If the substrate potential goes negative, transistor Q2, whose base current is supplied by transistor Q3 (FIG. 4), goes into saturation, so that the isolation region ISO is biased at a voltage equal to the negative potential of the substrate plus VCE,sat(Q2).

The drawback of the circuits shown in FIGS. 3 and 4 is that they require a supply voltage Vd for their operation. On the contrary, in the arrangement of FIG. 2, the control signal TRIGGER which determines the coil charge time, is also used as a supply voltage for the control circuitry of the VIPower integrated circuit. Signal TRIGGER is not activated when an inadvertent inversion of the battery polarity can take place, so that in this condition the VIPower circuit lacks a voltage supply. Consequently, the circuits of FIGS. 3 and 4 cannot be used, because there is no supply voltage Vd.

In view of the state of art described, it is an object of the present invention to provide a structure not affected by the above-mentioned drawbacks.

SUMMARY OF THE INVENTION

According to the present invention, this and other objects are achieved by an integrated circuit including a vertical power component having a terminal formed by a chip substrate of a first conductivity type, a control circuit thereof, the control circuit isolated from the substrate by an isolation region of a second conductivity type, and a protection structure against polarity inversion of a substrate potential, comprising a first bipolar transistor with an emitter connected to said isolation region and a collector connected to a reference potential input of the integrated circuit, a bias circuit for biasing the first bipolar transistor in a reverse saturated mode when the substrate potential is higher than the reference potential, and a second bipolar transistor with an emitter connected to the substrate and a base coupled to the isolation region for coupling the isolation region to the substrate through a high-impedance when the substrate potential is lower than the reference potential.

BRIEF DESCRIPTION OF THE DRAWINGS

The features and advantages of the present invention will be made apparent by the following detailed description of an embodiment thereof, illustrated as a non-limiting example only in the annexed drawings, wherein.

DETAILED DESCRIPTION

Figure 1:
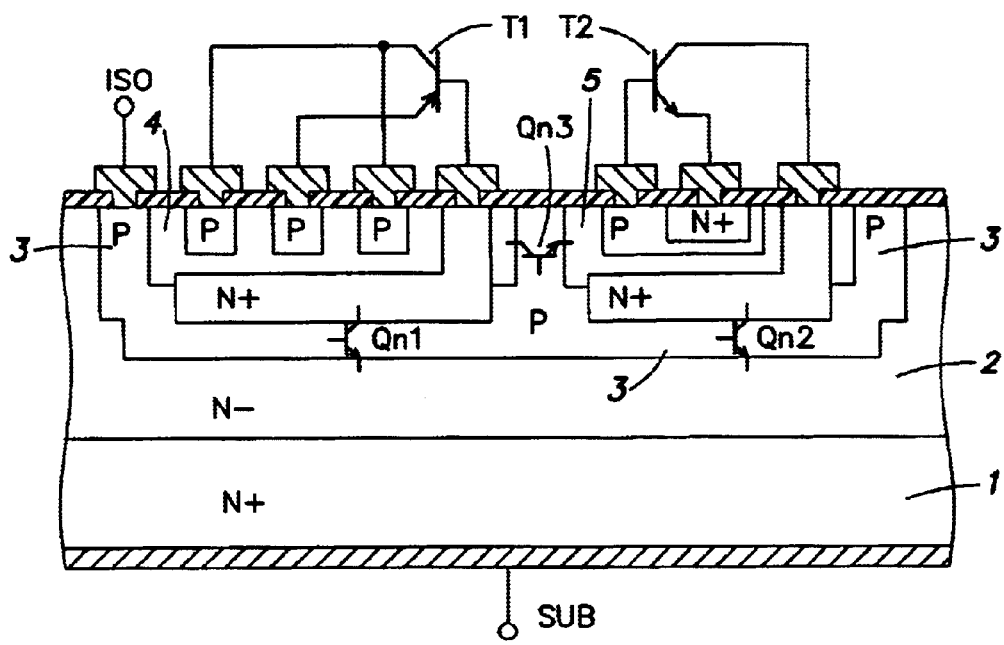
FIG. 1 is a cross-section of a control circuitry portion of a VIPower integrated circuit.
Figure 5:
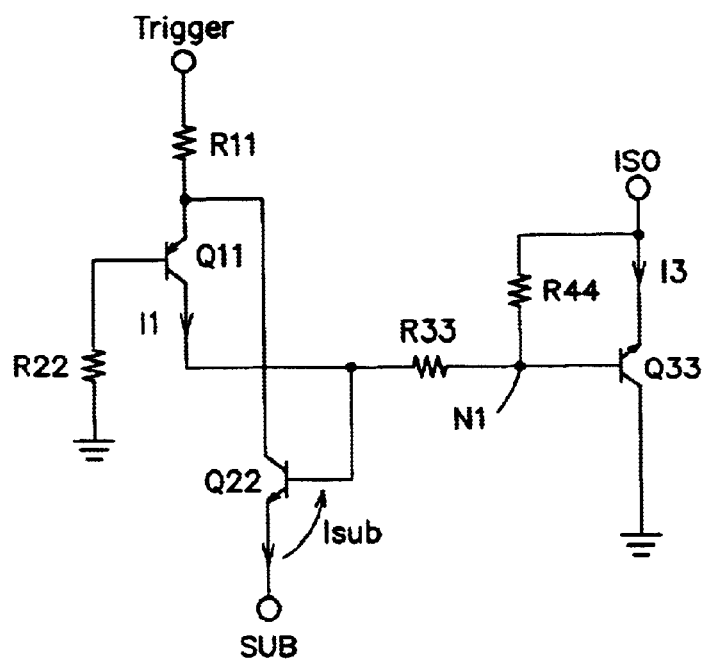
FIG. 5 is an electrical diagram of a structure according to the present invention.

Referring to FIG. 5, a schematic of a structure according to the invention is shown. The structure comprises an NPN bipolar transistor Q33 with collector connected to ground, emitter connected to the isolation region ISO of the control circuitry of a VIPower integrated circuit (e.g., P type region 3 in FIG. 1), and base connected to the isolation region ISO through a resistor R44. The base of transistor Q33 is also connected, through a resistor R33, to the collector of a PNP bipolar transistor Q11 having emitter connected to the signal TRIGGER (the control input to the VIPower, FIG. 2) through a resistor R11, and base connected to ground through a resistor R22. The collector of transistor Q11 is further connected to the base of an NPN transistor Q22 having collector connected to the emitter of transistor Q11, and emitter connected to the substrate of the VIPower integrated circuit.

The circuit of FIG. 5 operates in the following way.

In normal operating conditions, with the substrate at a positive potential, when signal TRIGGER is at the high logic level (5 V), bipolar transistor Q11 biases bipolar transistor Q33 in reverse saturation condition. The isolation region ISO is thus kept at VCEsat(Q33), the emitter-collector saturation voltage of transistor Q33. Since in this condition the substrate voltage (SUB) is positive, bipolar transistor Q22 is off. Bipolar transistor Q22 is a vertical transistor whose emitter is formed by the N+ substrate of the VIPower integrated circuit (FIG. 7).

Figure 2:
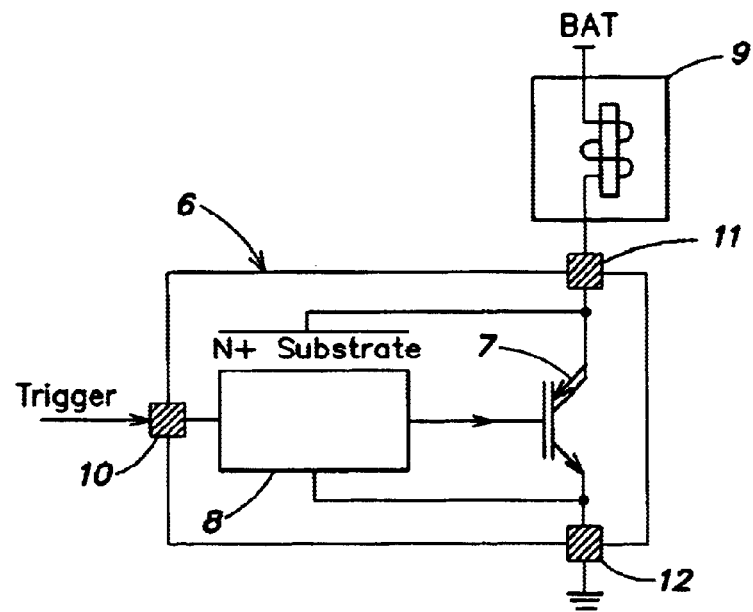
FIG. 2 is a schematic electrical diagram of a possible use of a VIPower integrated circuit.
Figure 3:
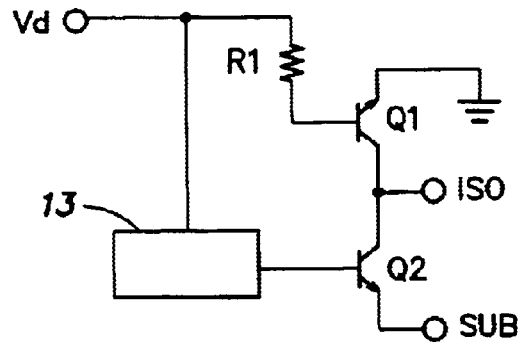
FIG. 3 shows a conventional circuit suitable for biasing an isolation region of the control circuitry of a VIPower integrated circuit.
Figure 4:
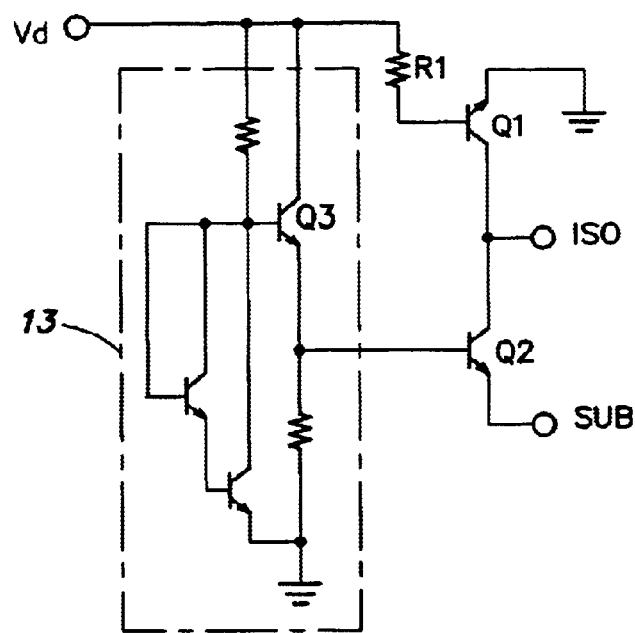
FIG. 4 shows a possible practical embodiment of the conventional circuit of FIG. 3.

It is now assumed the substrate (SUB) is biased at a negative voltage, for example in consequence of an inversion of polarity of the battery in the circuit of FIG. 2. Signal TRIGGER can either be at ground (0 V) or at high impedance (as mentioned in the introductory part of the description, when battery polarity is inverted signal TRIGGER is not active being an abnormal condition). In these conditions transistor Q11 is off and does not furnish base current to transistor Q33. Transistor Q33 is thus also off. Transistor Q22 is on, and the base electrode thereof is at one VBE above the negative voltage applied to the substrate SUB. The isolation region ISO is consequently held substantially at the negative potential of the substrate plus one VBE and it is in a high impedance condition. In this condition, the voltage across the base-collector junction of transistor Q33 is substantially equal to the voltage applied to the substrate, minus the base-emitter voltage (VBE) of transistor Q22. The base-collector junction of transistor Q33 must be capable of sustaining the voltage applied thereacross. Also, the breakdown voltage between the collector and the emitter of transistor Q33 must be higher than the voltage applied to the substrate, otherwise the P type isolation region ISO and the N type substrate would form a forward biased diode. These two conditions are satisfied by operating bipolar transistor Q33 is the inverse region, with the collector connected to ground and the emitter connected to the isolation region ISO, as shown in FIG. 5, so that the breakdown voltages are higher than the maximum negative voltage that can be applied to the substrate.

Figure 7:
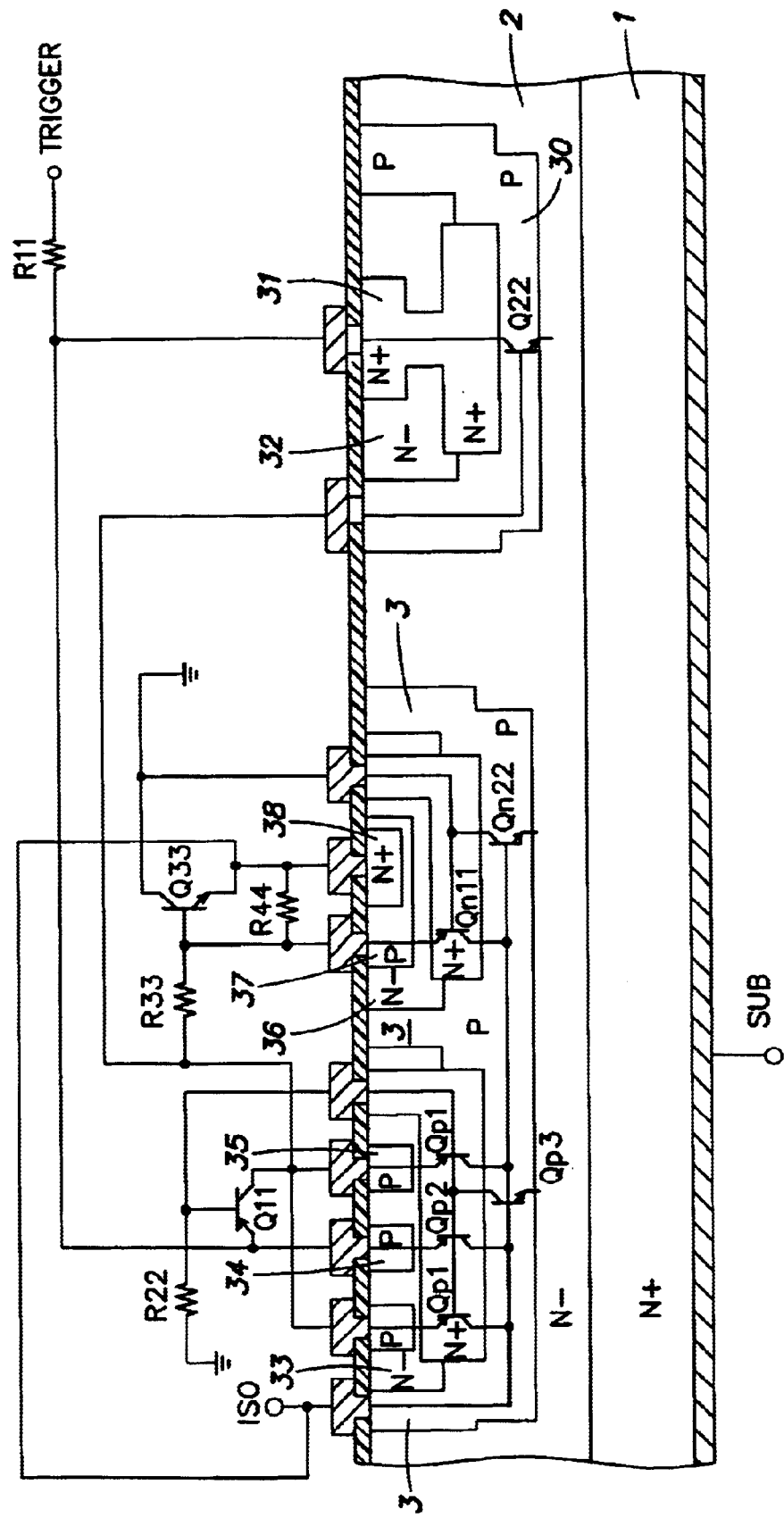
FIG. 7 is a device cross-section of the structure of FIG. 6.

FIG. 7 is a device cross-section showing the structure of transistors Q11, Q22 and Q33. As visible, transistors Q11 and Q33 are formed inside the P type isolation region 3 which also contains the control circuitry of the VIPower integrated circuit. Transistor Q11 is formed inside an isolated N– layer portion 33 delimited by the isolation region 3; the emitter of transistor Q11 is a P type region 34 formed in the N– layer portion 33; the collector of transistor Q11 is a P type region 35 surrounding region 34; the base is the N– layer portion 33. Transistor Q33 is formed inside an isolated N– layer portion 36 delimited by the isolation region 3; the base of transistor Q33 is a P type region 37 formed inside the N– layer portion 36; the emitter of transistor Q33 is an N+ region 38 formed inside region 37; the collector of transistor Q33 is the N– layer portion 36. Transistor Q22 is a vertical transistor and has a base formed by a P type region 30 isolated from the P type isolation region 3. The collector of transistor Q22 is an N+ region 31 formed inside an N– layer portion 32 delimited by P type region 30. The emitter of transistor Q22 is the N+ substrate 1.

Figure 6:
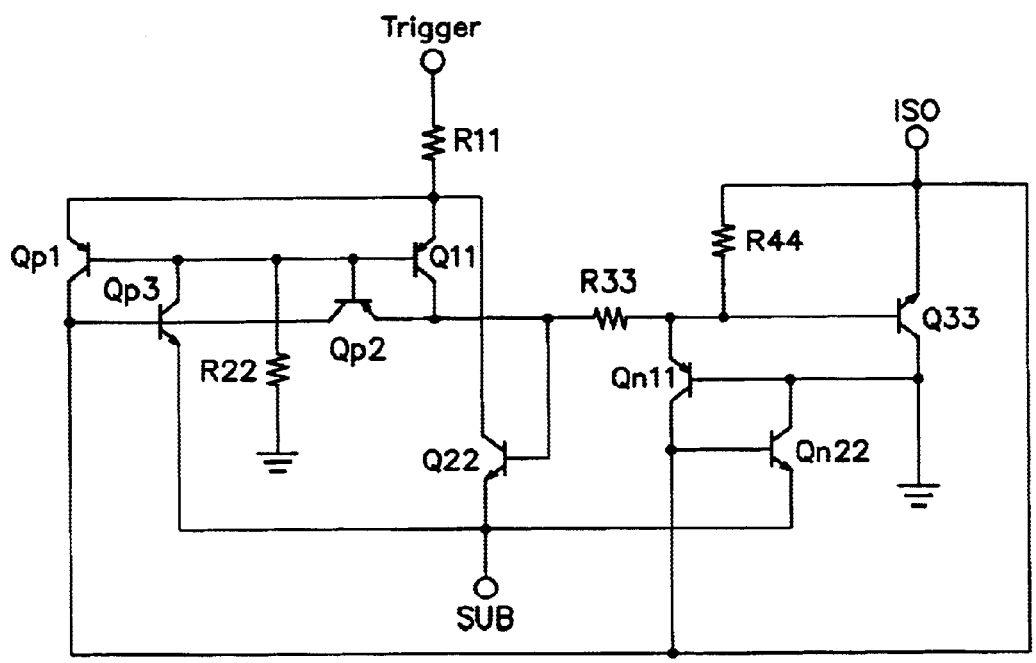
FIG. 6 is an electrical schematic diagram of the structure of FIG. 5, showing the associated parasitic elements.

Another important advantage of operating transistor Q33 in the inverse region is the improved control of parasitic components, as will be now discussed. FIG. 6 is an electrical schematic diagram of the circuit of FIG. 5, also showing parasitic components which were not depicted in FIG. 5. Reference is also made to FIG. 7, where the physical origin of the parasitic components can be clearly understood. When a negative voltage is applied to the substrate SUB, the ground voltage is the highest voltage in the integrated circuit. Since the collector of transistor Q33 is connected to ground, the parasitic bipolar transistor Qn11 associated with transistor Q33 is off and cannot supply base current to the parasitic bipolar transistor Qn22. Transistor Q22 is a vertical bipolar transistor with a structure similar to that of the parasitic bipolar transistors. Transistor Q22 allows for controlling the parasitic transistors. If transistor Q22 were absent, the parasitic bipolar transistor Qp3 associated with transistor Q11, which turns on when the potential of substrate goes negative, would turn transistor Q11 on. Transistor Q11 would drive transistor Q33 into saturation. Transistor Q33 would bias the isolation region ISO at the ground potential, thus creating a conductive path between ground and the substrate through the diode formed by the isolation region and the substrate. Transistor Q22 is designed to have a gain higher than that of the parasitic bipolar transistors. Transistor Q22 turns on and subtracts current from the emitter of transistor Q11, preventing this current from being supplied to the base of transistor Q33. Transistor Q22 thus forms a regulation loop that allows for controlling the effect of parasitic transistors, which could otherwise bring transistors Q11 and Q33 into conduction. By using polysilicon resistors, no further parasitic elements are introduced in the structure.

Figure 8:
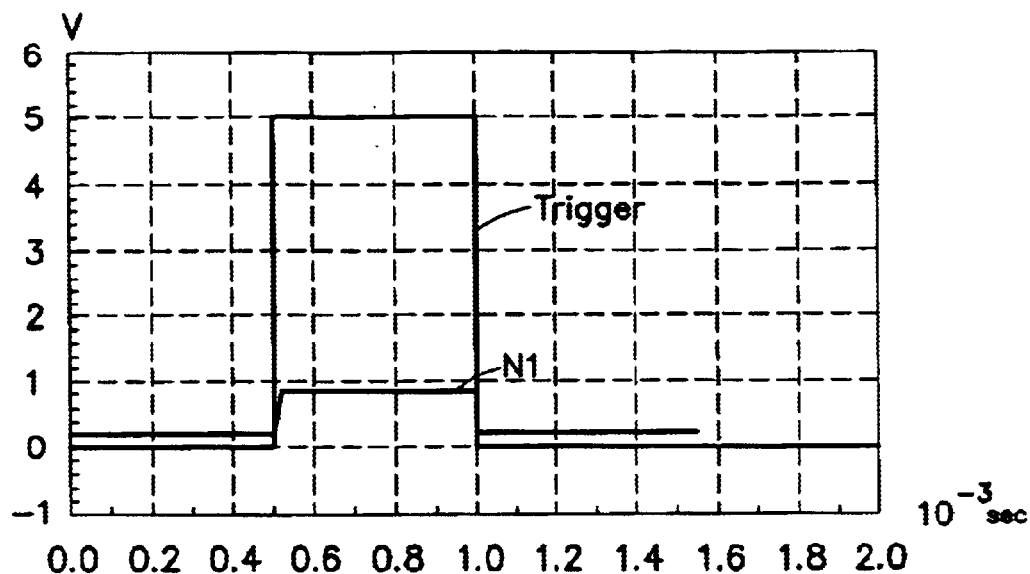
FIG. 8 is a voltage-time diagram resulting from simulation of the circuit according to the invention.
Figure 9:
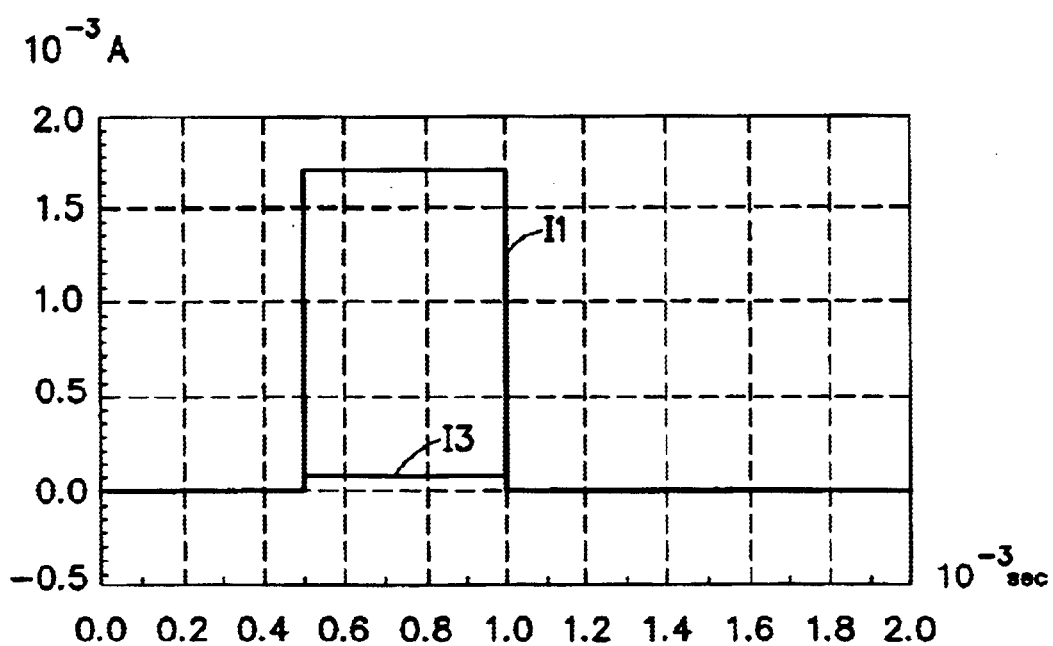
FIG. 9 is a current-time diagram resulting from simulation of the circuit of the invention.

FIG. 8 is a voltage-time diagram of the signal TRIGGER and of node N1 (FIG. 5) resulting from a simulation of the circuit. This simulation refers to a normal operating condition, with the substrate SUB biased at a positive potential. It is visible that when signal TRIGGER switches to the high logic level (5 V) node N1 (base of transistor Q33) goes to VCEsat(Q33). Referring to FIG. 9, which is current-time diagram resulting from the same simulation, it is visible that current I1 (collector current of transistor Q11, supplied to the base of transistor Q33) is approximately equal to 1.7 mA, sufficient for saturating transistor Q33. This high current value is motivated by the fact that since transistor Q33 is in the inverse region, it has a low gain.

Figure 10:
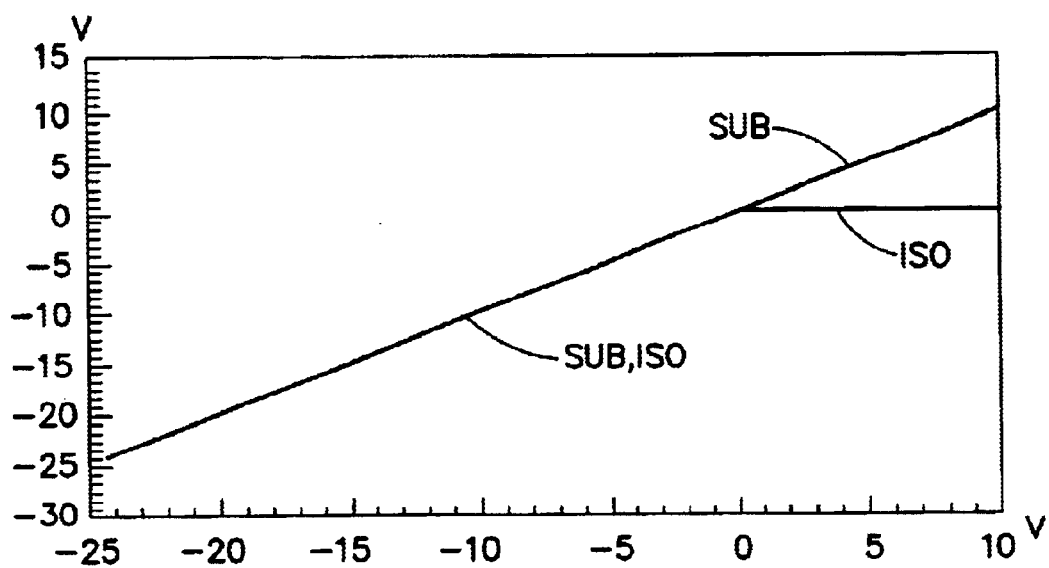
FIG. 10 is a voltage-voltage diagram resulting from simulation of the circuit of the invention.
Figure 11:
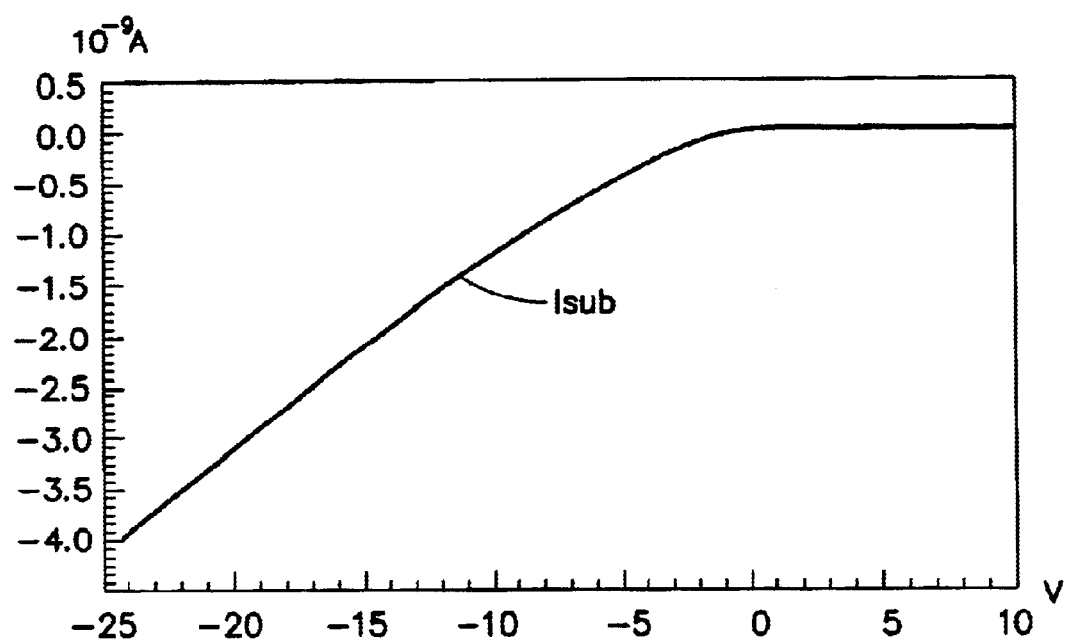
FIG. 11 is a current-voltage diagram resulting from simulation of the circuit of the invention.

FIGS. 10 and 11 are diagrams resulting from a simulation of the circuit when the substrate is biased at a negative potential. From FIG. 10 it can be seen that the potential of the isolation region ISO follows that of the substrate for negative values of the latter. FIG. 11 shows that when a negative potential is applied to the substrate the substrate current Isub is negligible.

Figure 12:
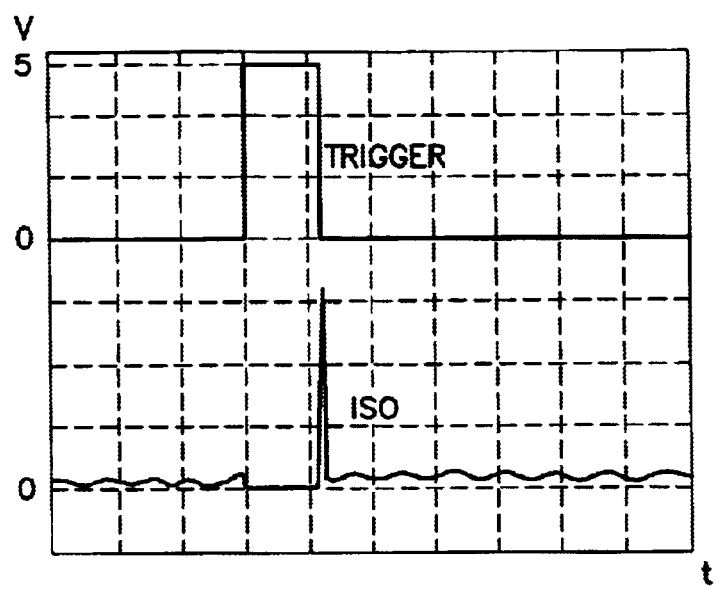
FIG. 12 is a voltage-time diagram resulting from measurement of the circuit according to the invention.

FIG. 12 is a time diagram obtain from measurements, in a circuit arrangement corresponding to that of FIG. 2. It is noted than when signal TRIGGER switches to the high loci level, the isolation region ISO is forced at the potential VCEsat(Q33), while when signal TRIGGER is at the low logic level (Q11 off) the isolation region is in an high impedance condition and is substantially floating. The spike appearing in the voltage of the isolation region at the high-to-low transition of signal TRIGGER is due to the overvoltage across the coil 9.

Figure 13:
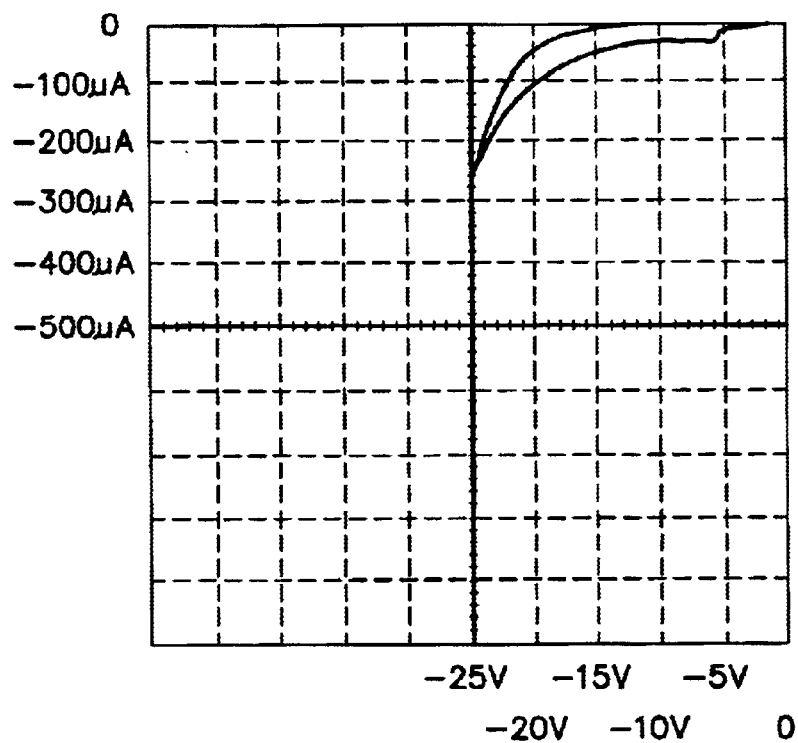
FIG. 13 is a current-voltage diagram resulting from measurement of the circuit according to the invention, in a condition of polarity inversion of the substrate voltage.

FIG. 13 is a diagram resulting from measurement showing the current absorption of the VIPower integrated circuit when the potential of the substrate SUB is negatively biased. It is possible to see that when the polarity of the potential applied to the substrate is inverted, the absorbed current is very small (approximately 233 $\mu$A @–25V of substrate to ground voltage); substantially, the current is the one resulting from leakage.

Compared to the known solutions, the circuit of the present invention can be used even when no supply voltage is present. The circuit guarantees that, when the polarity of the substrate potential is inverted, the current consumption, and thus the power dissipated, is negligible. The circuit is simple, being formed by only three transistors and four resistors. The circuit thus occupies a small area of the integrated circuit chip.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit including a vertical power component having a terminal formed by a chip substrate of a first conductivity type, a control circuit thereof, the control circuit isolated from the substrate by means of an isolation region of a second conductivity type, and a protection structure against polarity inversion of a substrate potential comprising a first bipolar transistor with an emitter connected to said isolation region and a collector connected to a reference potential input of the integrated circuit, the reference potential input providing a reference potential, a bias circuit for biasing the first bipolar transistor in a reverse saturated mode when the substrate potential is higher than the reference potential, and a second bipolar transistor with an emitter connected to the substrate and a base coupled to the isolation region for coupling the isolation region to the substrate through a high-impedance when the substrate potential is lower than the reference potential and the first bipolar transistor is off.

2. An integrated circuit according to claim 1, wherein said bias circuit comprises a third bipolar transistor with an emitter coupled to control terminal of the integrated circuit and a collector coupled to a base of the first bipolar transistor, said control terminal receiving an external control signal which is used by the control circuit to cause switching of the power component, said control signal being used to provide a voltage supply to the control circuit and to the bias circuit.

3. An integrated circuit according to claim 2, wherein said first bipolar transistor is a vertical transistor having an emitter formed by said substrate, a collector formed by a second doped region of the first conductivity type, and a base formed by a first doped region of the second conductivity type formed in the substrate and within the first doped region.

4. An integrated circuit according to claim 3, wherein said first and third bipolar transistors are isolated from the substrate by said isolation region.

5. An integrated circuit according to claim 4, wherein said first conductivity type is the N type, said second conductivity type is the P type, said first and second bipolar transistors are NPN transistors, and said third bipolar transistor is a PNP transistor.

6. An integrated circuit according to claim 1, wherein said vertical power component is a vertical power bipolar transistor.

7. The integrated circuit of claim 1, wherein the first bipolar transistor couples the isolation region to the reference potential input when the substrate potential is higher than the reference potential.

8. The integrated circuit of claim 1, wherein the first bipolar transistor is off when the substrate potential is less than the reference potential.

9. The integrated circuit of claim 1, wherein the emitter of the first bipolar transistor is directly connected to the isolation region.

10. The integrated circuit of claim 1, wherein the collector of the first bipolar transistor is directly connected to the reference potential input.

11. The integrated circuit of claim 1, wherein the emitter of the second bipolar transistor is directly connected to the substrate.

12. A semiconductor device, comprising:
   (A) a vertical power component having a terminal formed by a substrate of a first conductivity type;
   (B) a control circuit, isolated from the substrate by an isolation region of a second conductivity type; and
   (C) a protection structure against polarity inversion of a substrate potential, comprising:
      (i) a first bipolar transistor having an emitter connected to said isolation region and a collector connected to a reference potential input of the integrated circuit, the reference potential input providing a reference potential;
      (ii) a bias circuit that biases the first bipolar transistor in a reverse saturation mode when the substrate is at a potential higher than the reference potential; and
      (iii) means for coupling the isolation region to the substrate through a high impedance when the substrate potential is lower than the reference potential and the first bipolar transistor is off.

13. The device of claim 12, wherein the second bipolar transistor forms a regulation loop that reduces parasitic transistor action from affecting the first bipolar transistor and the bias circuit.

14. The device of claim 12, wherein the vertical power component comprises a vertical power bipolar transistor.

15. The semiconductor device of claim 12, wherein the first bipolar transistor couples the isolation region to the reference potential input when the substrate potential is higher than the reference potential.

16. The semiconductor device of claim 12, wherein the first bipolar transistor is off when the substrate potential is less than the reference potential.

17. The semiconductor device of claim 12, wherein the emitter of the first bipolar transistor is directly connected to the isolation region.

18. The semiconductor device of claim 12, wherein the collector of the first bipolar transistor is directly connected to the reference potential input.

19. An integrated circuit including a vertical power component having a terminal formed by a chip substrate of a first conductivity type, a control circuit thereof, the control circuit isolated from the substrate by means of an isolation region of a second conductivity type, and a protection structure against polarity inversion of a substrate potential comprising a first bipolar transistor with an emitter connected to said isolation region and a collector connected to a reference potential input of the integrated circuit, a bias circuit for biasing the first bipolar transistor in a reverse saturated mode when the substrate potential is higher than the reference potential, and a second bipolar transistor with an emitter connected to the substrate and a base coupled to the isolation region for coupling the isolation region to the substrate through a high-impedance when the substrate potential is lower than the reference potential, and
   wherein the emitter of the first bipolar transistor is directly connected to the isolation region.

20. A semiconductor device, comprising:
   (A) a vertical power component having a terminal formed by a substrate of a first conductivity type;
   (B) a control circuit, isolated from the substrate by an isolation region of a second conductivity type; and
   (C) a protection structure against polarity inversion of a substrate potential, comprising:
      (i) a first bipolar transistor having an emitter connected to said isolation region and a collector connected to a reference potential input of the integrated circuit;
      (ii) a bias circuit that biases the first bipolar transistor in a reverse saturation mode when the substrate is at a potential higher than a reference potential; and
      (iii) means for coupling the isolation region to the substrate through a high impedance when the substrate potential is lower than the reference potential,
   the first bipolar transistor is directly connected to the isolation region.

* * * * *

UNITED STATES PATENT AND TRADEMARK OFFICE
CERTIFICATE OF CORRECTION

PATENT NO.   : 6,815,779 B1
DATED         : November 9, 2004
INVENTOR(S)  : Antonino Torres Sergio Tommaso Spampinato It is certified that error appears in the above-identified patent and that said Letters Patent is hereby corrected as shown below:

Column 1,
Line 9, should read:
-- The present invention relates to the field of integrated --

Column 8,
Line 47, should read
-- wherein the emitter of the first bipolar transistor is directly connected to the --

Signed and Sealed this

First Day of February, 2005

JON W. DUDAS
*Director of the United States Patent and Trademark Office*